(12) United States Patent
Väisänen

(10) Patent No.: US 6,324,389 B1
(45) Date of Patent: *Nov. 27, 2001

(54) METHOD AND CIRCUIT ARRANGEMENT FOR PROCESSING A RECEIVED SIGNAL

(75) Inventor: Risto Väisänen, Salo (FI)

(73) Assignee: Nokia Mobile Phones Ltd., Espoo (FI)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/117,881
(22) PCT Filed: Feb. 6, 1997
(86) PCT No.: PCT/FI97/00073
§ 371 Date: Oct. 9, 1998
§ 102(e) Date: Oct. 9, 1998
(87) PCT Pub. No.: WO97/29552
PCT Pub. Date: Aug. 14, 1997

(30) Foreign Application Priority Data

Feb. 8, 1996 (FI) .......................................... 960577

(51) Int. Cl.[7] .................................................. H04Q 7/20
(52) U.S. Cl. ....................................... 455/324; 455/234.1
(58) Field of Search ............................... 455/214, 226.1, 455/296, 303, 309, 312, 334, 338, 234.1, 324; 375/317, 319, 346

(56) References Cited

U.S. PATENT DOCUMENTS

| | | | |
|---|---|---|---|
| 4,745,594 | 5/1988 | Takahashi | 370/51 |
| 5,212,826 | 5/1993 | Rabe et al. | 455/214 |
| 5,301,367 | 4/1994 | Heinonen | 455/76 |
| 5,359,652 | 10/1994 | Mulder et al. | 379/386 |
| 5,390,168 | 2/1995 | Vimpari | 370/30 |
| 5,461,340 | 10/1995 | Chahabadi et al. | 329/349 |
| 5,471,652 | 11/1995 | Hulkko | 455/76 |
| 5,519,885 | 5/1996 | Vaisanen | 455/76 |
| 5,663,988 | * 9/1997 | Neustadt | 375/319 |
| 5,724,653 | * 3/1998 | Baker et al. | 455/296 |
| 5,740,521 | 4/1998 | Hulkko et al. | 455/76 |
| 5,794,159 | 8/1998 | Portin | 455/553 |
| 5,898,912 | * 4/1999 | Heck et al. | 455/234.2 |
| 6,009,126 | * 12/1999 | Van Bezooijen | 375/319 |

FOREIGN PATENT DOCUMENTS

0594894 A1    5/1994    (EP).

OTHER PUBLICATIONS

Finnish Official Action PCT International Search Report.
"A silicon transceiver for a 900MHz GSM hand set", Microwave Engineering Europe, Jan. 1993, pp. 59–63.
"The Challenges for analogue circuit design in mobile radio VLSI chips", Microwave Engineering Europe, May 1993, pp. 53–59.

* cited by examiner

Primary Examiner—Nay Maung
(74) Attorney, Agent, or Firm—Perman & Green, LLP

(57) ABSTRACT

A direct voltage component of a signal which has been received and converted to a baseband is separated by a first separator in a signal line. Also the direct voltage components of both the signal preceding the separator and the signal following the separator are controlled by control signals. Thus a baseband signal line preceding the first separator can be direct current coupled.

18 Claims, 5 Drawing Sheets

METHOD AND CIRCUIT ARRANGEMENT FOR PROCESSING A RECEIVED SIGNAL

The invention relates to a method and a circuit arrangement for receiving a radio frequency signal. The invention can be applied preferably in receivers of digital, time-division data transfer systems, such as in mobile stations.

In a direct conversion receiver, that is in a zero intermediate frequency receiver, a radio frequency signal is converted directly to a baseband without there being intermediate frequency. Since intermediate frequency stages are not needed, only a few components are needed in a receiver, which makes it a preferable solution for use in various applications. In mobile stations, direct conversion receivers are, however, used rarely. On one hand, this is due to the fact that prior known methods are almost impossible to implement in practice in industrial manufacturing or on the other hand, in presented solutions the unique features of digital mobile phone systems have not been taken into consideration. The most important problem in the implementation of a direct conversion receiver is the control of offset voltages. By an offset voltage one means voltage which has become summed up in a signal, essentially direct voltage which is not included in a received useful signal.

Figure 1:
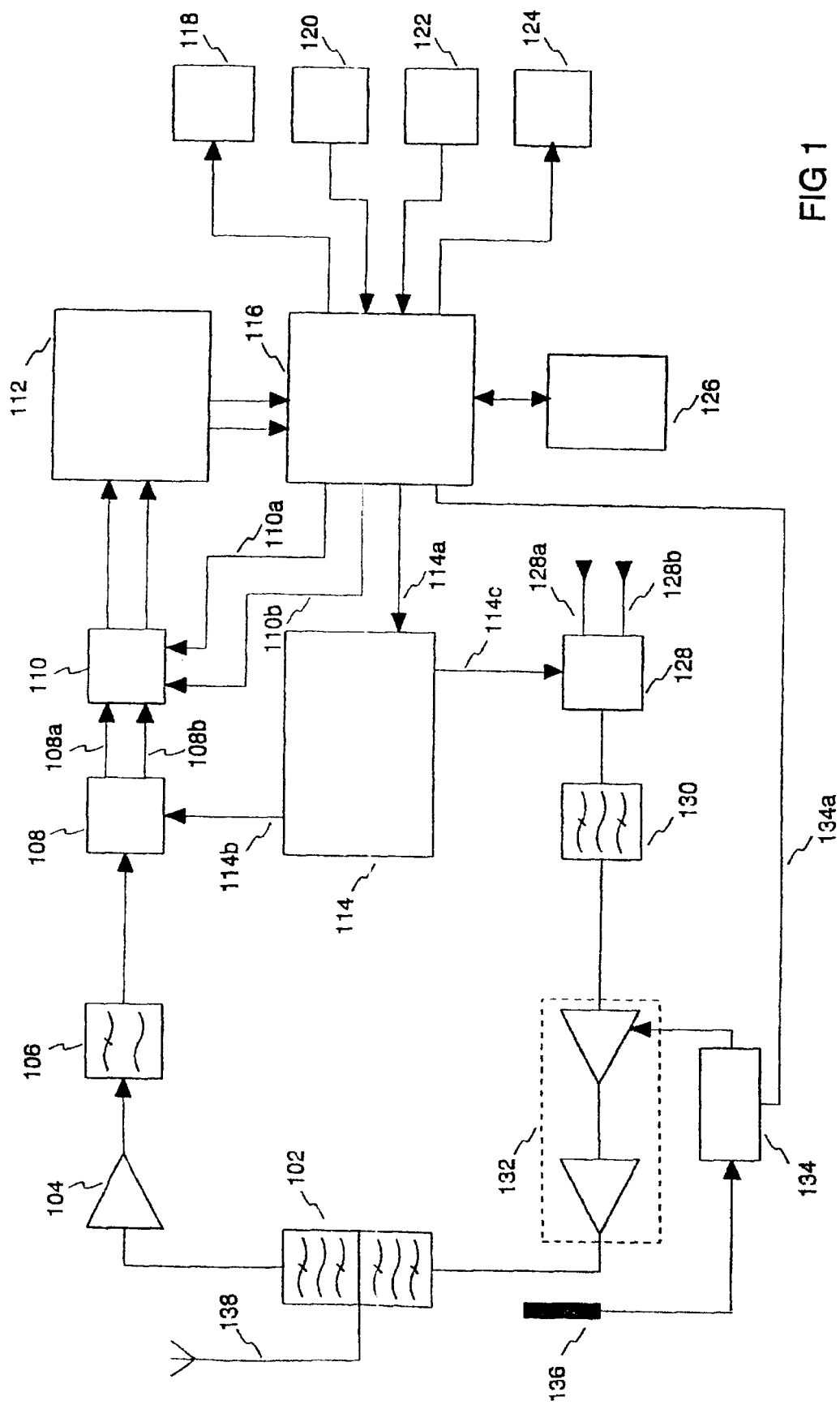

FIG. 1 shows a prior known block diagram of a transmitter-receiver of a mobile station and in this block diagram, the receiver is a direct conversion receiver. In it, an RF signal received by an antenna 138 is conducted via a duplex filter 102 to a pre-amplifier 104. The purpose of the duplex filter is to permit the use of the same antenna both in transmitting and receiving. Instead of a duplex filter, also a synchronous antenna changeover switch can be used in a time-division system. An RF signal which is received from an amplifier 104 is low-pass filtered 106 and demodulated in an I/Q demodulator 108 into an in-phase signal 108a and into a quadrature signal 108b. A local oscillator signal 114b which is needed in demodulation is received from a synthesizer 114. In block 110, removal of direct voltage and automatic gain control (AGC) are carried out. Block 110 is controlled by a processing block 116 which may contain, for example, a microprocessor. Automatic gain control is regulated by a signal 110a and removal of the offset voltage is regulated by a signal 110b. Signals received from block 110 are converted into digital signals in block 112 from which the signals are further led to digital signal processing circuits in the processing block 116.

The transmitter unit comprises an I/Q modulator 128 which forms from an in-phase signal 128a and from a quadrature signal 128b, a carrier-frequency signal which is low-pass filtered and/or high-pass filtered by a filter 130. The carrier-frequency signal is amplified by an RF amplifier 132 and the amplified signal is transferred via a duplex filter 102 to an antenna 138. A power control unit 134 of the transmitter controls the amplification of the RF amplifier 132 on the basis of the measured output power 136 and of the control 134a received from the processor.

FIG. 1 also shows, attached to the processing unit, the memory unit 126 and user interface means which comprise a display 118, a keyboard 120, a microphone 122 and an earpiece 124.

Practical solutions for implementation of a direct conversion receiver have been described more closely, for example, in the following publications:

[1] Microwave Engineering Europe, January 1993, pages 59 . . . 63,

[2] Microwave Engineering Europe, May 1993, pages 53 . . . 59 and

[3] patent application EP 0 594 894 AI.

The solution for a receiver presented in the reference [1] is based on direct voltage coupled baseband parts and in them the DC offset voltage compensations are attained via extremely complicated control systems which contain D/A converters, A/D converters, digital filters and predicting control algorithms. Various correction values are stored into memories, for example, for different channels and for AGC adjustments.

When a DC-coupled baseband part is used, great fluctuations in direct voltage can create a problem. Fluctuations in a direct voltage component of a signal may be due to, for example, temperature changes in which case they are typically slow or, for example, due to variations in frequency or level of a local oscillator signal in which case the fluctuations in direct voltage are rapid. Also a received signal may contain, due to modulation, a direct voltage component which cannot be removed, which makes the determination of the real offset voltage extremely difficult and complicated. When the above mentioned complicated solutions for control of the offset voltage are used, the manufacturing costs of the device become so great that the advantages of the direct conversion receiver are lost.

The advantage of the AC-coupled baseband parts is that slow fluctuations in offset voltage are dissipated and the total amount of the offset voltage can be reduced. The disadvantage is, however, that there may be charges which remain in the separating capacitors of the direct voltage and which discharge slowly.

Figure 2:
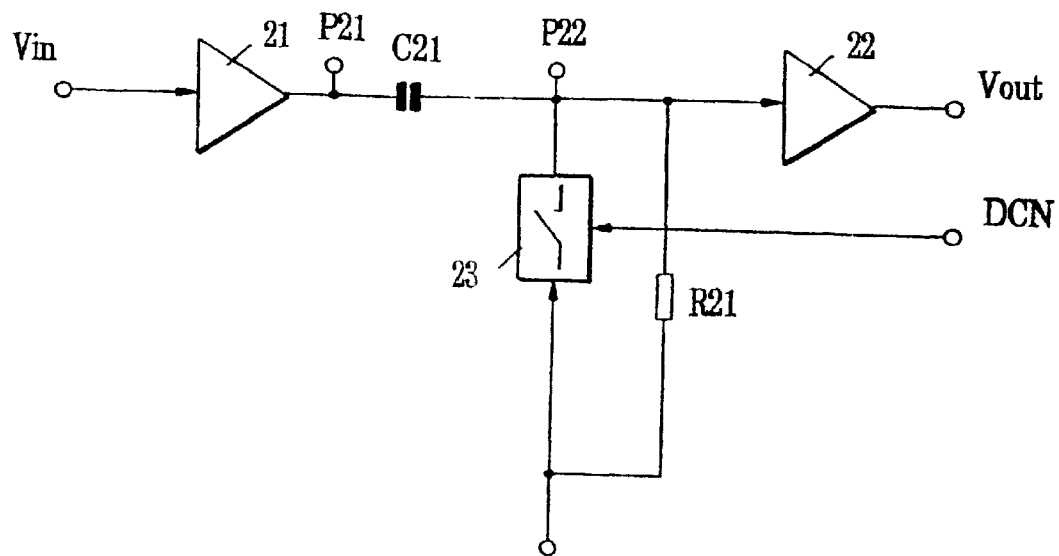

FIG. 2 shows a prior known solution for reducing the offset voltage of a signal. In a circuit according to FIG. 2, a baseband signal Vin is conducted to an amplifier 21, the output P21 of which has been conducted via a capacitor C21 to the input P22 of an amplifier 22. In the place of the amplifier 22, it is also possible to have, for example, an analog/digital converter. A reference voltage has been conducted to the input of the amplifier 22 via a resistor R21. Prior to the start of the receiving, a short control pulse DCN connects a switch 23 to an on-state and then the output terminal of the capacitor C21 becomes set at a reference voltage Vref and at the point P22 if there is any offset voltage, it is dissipated. If, at the moment of the removal of the offset voltage, there is, for example, a positive baseband useful signal in addition to the offset voltage on the signal path, the DCN control pulse removes the offset voltage occurring at the point P22 but, as the DCN control pulse ends, a negative offset voltage is generated at the point P22. In this situation the offset voltage is thus not dissipated but the operation of the removing circuit of the offset voltage results in a new offset voltage which falls slowly towards the reference voltage Vref. The offset voltage caused by the removing circuit of the offset voltage depends on the extent of the instantaneous value of the baseband signal occurring in the capacitor C21 at the moment when the DCN control pulse ends.

In order to circumvent the new offset voltage resulting from the removing circuit of the offset voltage, in the solution described above, the zeroing of the offset voltage should be performed at such an instant when the received signal is essentially noise, which means in practice before the onset of the signal reception. In many time-division systems for mobile communications, such as GSM (Global System for Mobile Communications) and PCN (Personal Communications Network) systems, the power transmitted by the base station is not disconnected before the start of a new time interval. Thus there are baseband signals present in a receiver also before the start of the actual moment of reception, that is during the time when the offset voltage should be removed. This is why the earlier mentioned solution for reducing the offset voltage is not applicable in the above mentioned systems.

The aim of the invention is to devise a simple solution for implementation of a direct conversion receiver so that the above mentioned problems connected to the solutions according to prior art can be avoided.

One idea of the invention is that the direct voltage component of the signal which has been received and converted to a baseband is separated by the first separating means of direct voltage in a signal line and, in addition, the direct voltage components of both the signal preceding the separating means and of the signal following the separating means are controlled by control signals. Thus the baseband signal line which precedes the first separating means can be implemented essentially as direct voltage coupled. The control circuit of signal strength which precedes the above mentioned first separating means comprises preferably a second separating means for separating the direct voltage component occurring in the control circuit from constant potential of the circuit arrangement such as the ground level. Then one of the above mentioned control signals has been preferably arranged to control the charge state of the second separating means. The baseband signal following the separating means is preferably converted to a digital form for further processing of the signal.

A method according to the invention is characterized by the fact that the direct voltage component of the first signal preceding the above mentioned first separating means of direct voltage is controlled on the basis of the first control signal and the direct voltage component of the second signal following the above mentioned first separating means of direct voltage is controlled on the basis of the second control signal, which second control signal may be identical to said first control signal.

It is characteristic of a circuit arrangement according to the invention that the circuit arrangement comprises means for controlling the direct voltage component of a signal preceding the above mentioned separating means on the basis of the first control signal and means for controlling the direct voltage component of a signal following the separating means on the basis of the second control signal, which second control signal may be identical to the above mentioned first control signal. Preferable embodiments of the invention have been presented in the dependent claims.

Figure 6:
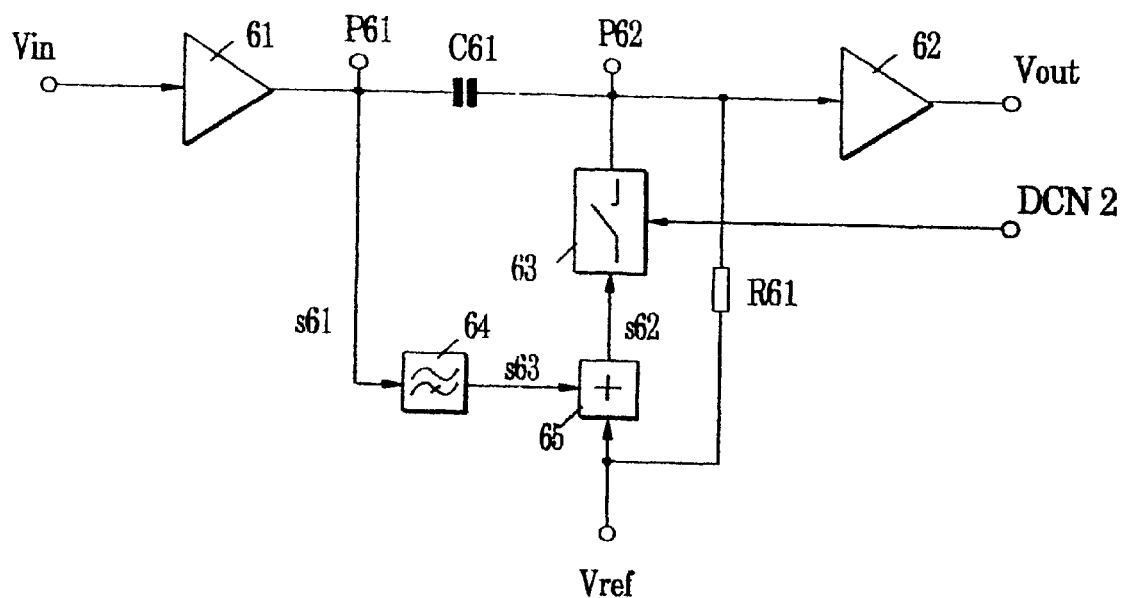
Figure 3:
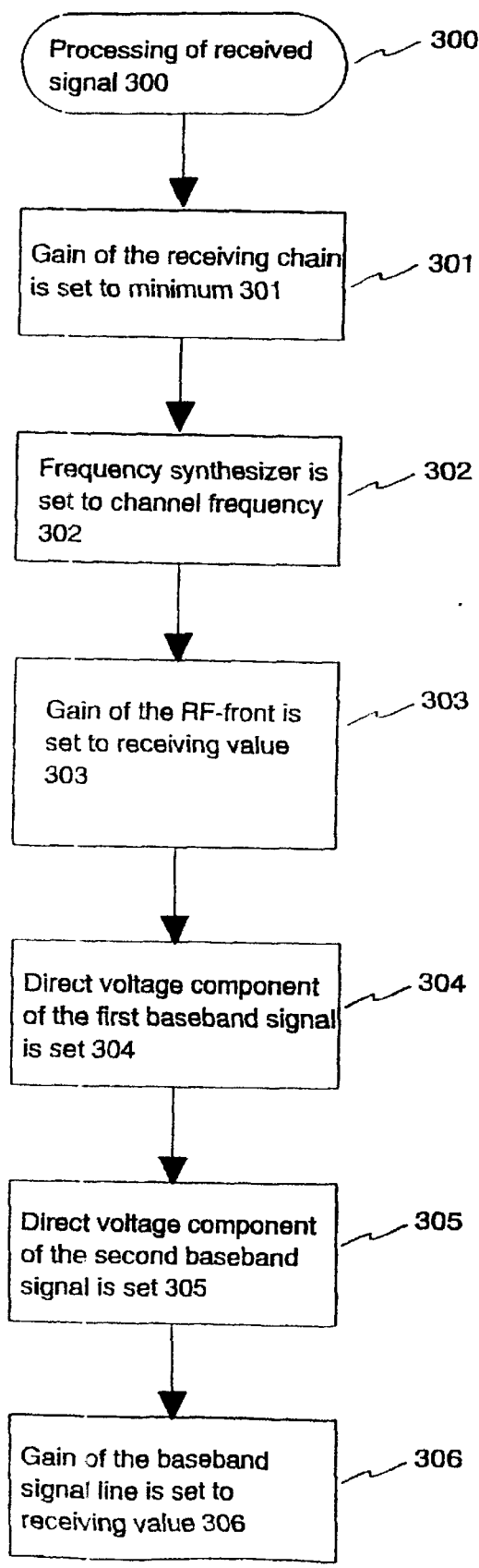
Figure 4:
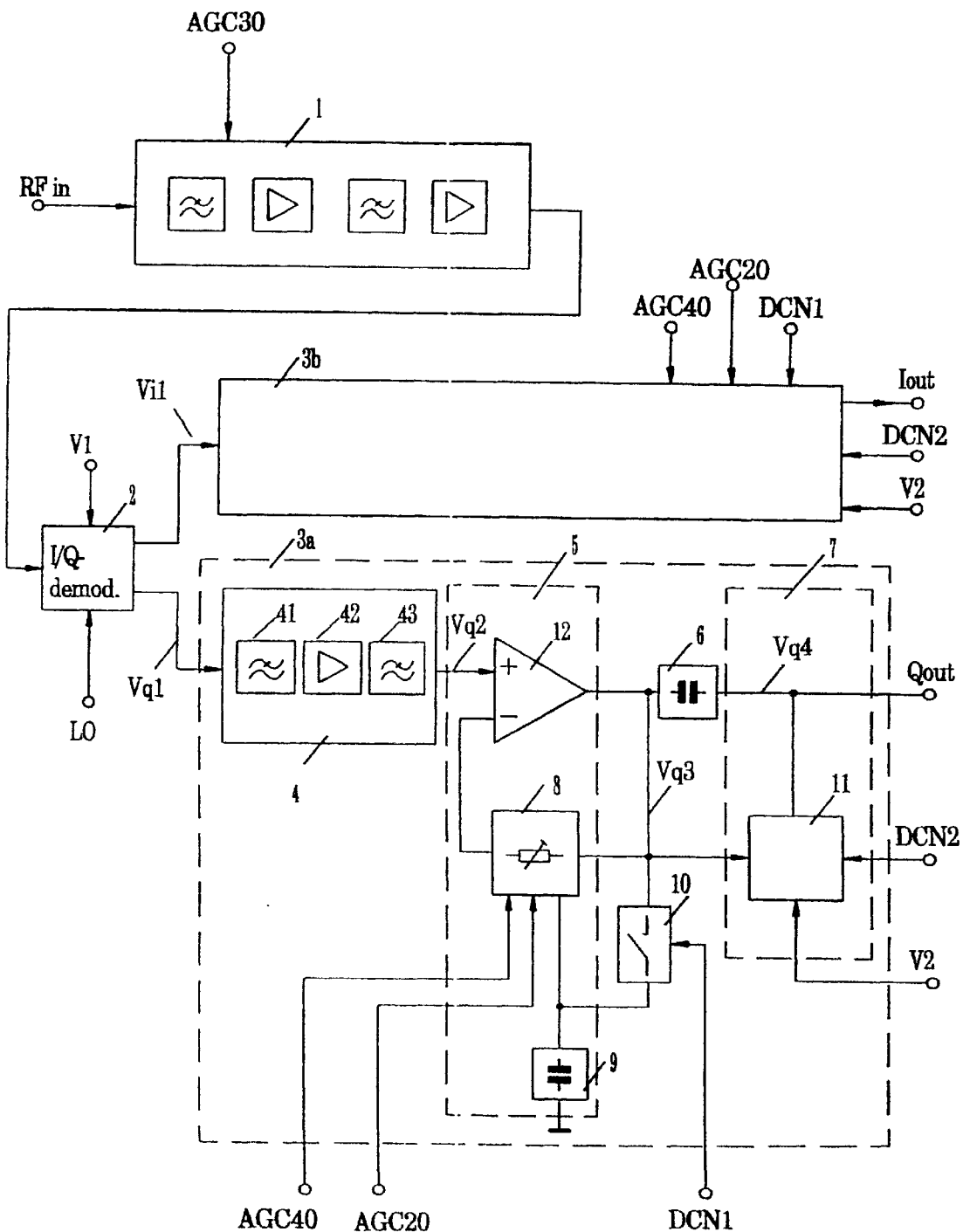
Figure 5:
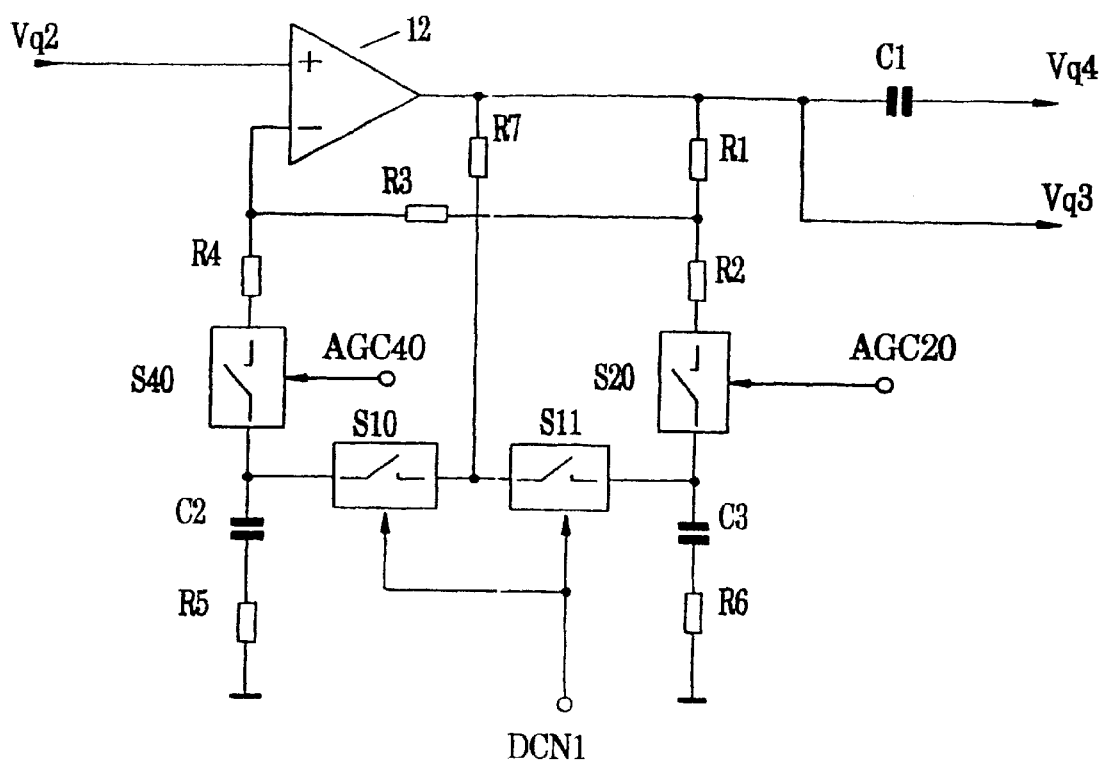

The invention is described in the following in more detail by using the attached drawings in which FIG. 1 shows a block diagram of a prior known mobile station in which a direct conversion receiver has been used, FIG. 2 shows a prior art circuit arrangement for removing the offset voltage, FIG. 3 shows a flow diagram of a method according to the invention, FIG. 4 shows a circuit arrangement according to the invention for the implementation of a direct conversion receiver, FIG. 5 shows an implementation of a circuit arrangement according to the invention as a circuit diagram and FIG. 6 shows a solution according to the invention for reducing the offset voltage.

FIGS. 1 and 2 were described above in the context of the description of the prior art. In the following, a method according to the invention is described briefly by using FIG. 3 and in more detail a circuit arrangement according to the invention and its operation by using FIGS. 4 and 5. Finally, a solution according to the invention for reducing the offset voltage is described by referring to FIG. 6.

FIG. 3 shows a flow diagram of a method 300 according to the invention. In it, at first all gain controls are set to a state in which gain is the lowest possible, block 301. After this, the local oscillator frequency of the frequency synthetizer is set at the channel frequency. After the frequency synthetizer has started to settle at the desired channel frequency, the gain control of the front of the RF is connected to the state in which it is going to be used during the time interval of reception, block 303. Thereafter, the direct voltage component of the first signal of the gain control part of the baseband frequency part is controlled by a control signal DCN1, block 304, and the direct voltage component of the second signal following the separating part of direct voltage is controlled by a control signal DCN2, block 305. Finally, prior to the onset of the time interval of reception, the controls DCN1 and DCN2 are removed and at the start of reception, a desired gain is chosen to the baseband frequency part by AGC controls of the baseband frequency part, block 306.

FIG. 4 shows a diagram depicting the principles of the circuit arrangement according to the invention. The parts presented in FIG. 4 correspond to blocks 104–112 of the transmitter/receiver part of the mobile station shown in FIG. 1. In the arrangement shown in FIG. 4, a radio frequency signal RFin received from an antenna is filtered and amplified in block 1 and demodulated to a baseband frequency in an I/Q demodulator 2. The RF front 1 of the receiver comprises RF amplification and RF filtering operations and the operation of automatic gain control AGC30.

The radio frequency signal is demodulated in an I/Q demodulator 2 which comprises phasing and power dividing elements, mixers and connection to the reference voltage VI. The reference voltage may be positive, negative or zero depending on the ways the I/Q demodulator and the baseband frequency part are implemented. Demodulation is implemented by using a local oscillator signal LO which is fed to the demodulator. A quadrature signal Vq1 and an in-phase signal Vi1 which are received from the demodulator are conducted to baseband frequency parts 3a and 3b. The baseband frequency parts 3a, 3b contain pre-amplification and filtering parts (4) which further contain a passive low-pass filtering part 41 directly after the mixers of the I/Q demodulator before the first active stage, a pre-amplification part 42 after which the second low-pass filters 43 are placed.

After pre-amplification and filtering, the signals are conducted to gain control parts 5 which contain an amplification part 12, a feedback part 8 and a second separating means 9 of direct voltage of the feedback part in which there is preferably at least one capacitor. The settling speed of the direct voltages of the gain control parts 5 is controlled by a selector switch 10 which is controlled by a signal DCN1.

To the output of the gain control, the first separating means 6 of direct voltage has been connected which comprises preferably at least one capacitor. After the separating part 6 of direct voltages, a removing system 7 for the offset voltage is placed and a solution for its implementation has been presented later on. Removing of the offset voltage occurring in a signal following the second separating means is controlled by a signal DCN2. To the separating part of direct voltage, a reference voltage V2 of the A/D converter part is additionally fed which can also be identical to the reference voltage VI.

One difference between the invention and prior known solutions for receivers is that the entire baseband signal path from the reference voltage VI of the I/Q demodulator to the output of the AGC amplifiers 5 has been coupled to direct voltage and on the signal path there is only one DC separating part 6 in each branch after the AGC part. Via this arrangement, for example, the following advantages are achieved compared to other methods:

Offset voltages which are present, for different reasons, at the output of the I/Q demodulator need not be removed from the output of the I/Q demodulator, from the output of the baseband pre-amplifier or from the output of the AGC amplifier part but direct voltages can fluctuate freely. By an accelerating switch 10, the time constant of the feedback circuit is kept rapid during the time when direct voltages are settling. After the direct voltage separating part 6 the direct voltage can be adjusted to be equal to the reference voltage V2 independent of the voltage at which the direct voltage operating point of the AGC amplifier part has settled. In this way, the advantages of the DC- and AC-coupled baseband parts have been combined and their disadvantages eliminated.

Digital control signals are used in the above described circuit arrangement according to FIG. 4 as follows:

Initially, all the AGC controls are in a state where the gain is as low as possible. After the frequency synthetizer has started settling at the desired channel frequency, the gain control AGC30 of the front is connected to the state in which it is going to be used during the time interval of reception. Thereafter, the time constant circuit of the gain control part of the baseband part is controlled to a fast state and the removing circuit 11 of the DC offset voltage to an active state by the controls DCN1 and DCN2. Prior to the start of the reception time interval, the controls DCN1 and DCN2 are removed. At the start of the reception, a desired gain is chosen to the baseband part by the AGC controls AGC20, AGC40 of the baseband part. When strong antenna signals are received, the control DCN1 is not necessarily needed since the used gain of the baseband part is small and correspondingly, the offset voltages are low.

In FIG. 4, there are two AGC controls shown, AGC20 and AGC40, of the baseband part but there can be more or less of them depending, for example, on the dynamic range of the A/D converter and the means of implementation of baseband parts.

FIG. 5 shows an example of how the blocks 5, 10 and 6 from FIG. 4 can be implemented. In it, the gain of the amplification circuit is determined on the basis of feedback resistors R1, R3 and R7 and of resistors R2, R4, R5 and R6 which are connected to the ground from the feedback circuit as well as of capacitors C1 and C2. The capacitors C1 and C2 operate as separators of direct voltage and thus there are two DC separating parts C1, R5 as well as C2, R6 at the feedback branch. By using two separate DC separating parts, the capacitance value of the capacitors used can be significantly reduced and the settling speed of direct voltages increased. The resistors R5 and R6 are intended to reduce the gain of the amplifier when the acceleration circuit is in use. The switches can be, for example, CMOS switches.

FIG. 6 shows a diagram depicting the principles of a circuit arrangement according to the invention for the implementation of the removing circuit 11 of the offset voltage. The circuit arrangement can be used, for example, in blocks 6 and 7 of the receiver shown in FIG. 4. In the arrangement shown in FIG. 6, the baseband signal Vin is conducted to the input of the amplifier 61 and the first signal s61 occurring at the output P61 of the amplifier 61 has been conducted into two branches: via the capacitor C61 to the amplifier 62 and via the high-pass filter 64 to the summer 65. By using the summer, the high-pass filtered signal s63 is summed to the reference voltage Vref. The summing result, that is the second signal s62, is led to the switch 63 which is controlled to an on-state by a short control pulse DCN. In the terminals of the capacitor C61 there is during the entire DCN control pulse virtually the same baseband signal in which case there is hardly any charge created by the baseband signal in the capacitor. In that way no significant offset voltage is formed at the output when the DCN control pulse ends and the switch 63 is switched off.

In the solution according to the invention, the baseband signal passing through the signal line is not interrupted for the duration of the DCN control pulse but a high-pass filtered baseband signal occurs at the output of the capacitor during the DCN control pulse. The lower limiting frequency of the high-pass filter 64 is preferably higher than the lower limiting frequency of the signal line. Then the offset voltage occurring in the second signal is attenuated rapidly and, by connecting the second signal to the output of the separating means, also the offset voltage occurring in it can be rapidly reduced. The higher lower limiting frequency of the high-pass filter does not, however, have any effect on the band of the actual signal line except during the DCN control pulse.

By using the present invention it is possible to devise simply a direct conversion receiver which can be used in the construction of a mobile station. In mobile stations, the implementation of direct conversion receivers results in considerable cost savings since only one frequency synthesizer is necessary and there is no need for intermediate frequency parts or intermediate frequency filters. Also the RF shielding requirement decreases and a duplex filter is not necessary. Thus it is possible to construct a mobile station which is smaller in size and lighter in weight by lower costs. Furthermore, the current consumption of the mobile station can be reduced.

By using the solution according to the present invention for controlling the direct voltage components of a signal, the following additional advantages can be achieved compared to solutions according to prior art:

digital signal processing is not necessary for correction of offset voltage since offset voltage can be reduced reliably from an analog signal, the dynamic range of analog/digital converters need not be increased because of the offset voltage, the operation of reducing the offset voltage does not cause even a momentary interruption of the baseband signal in a signal line, the solution according to the invention can be implemented by a small number of components which thus require little space and the additional manufacturing costs are very small, components which are needed in the circuit solution can be easily integrated to the connection of an A/D converter, by using the solution according to the invention, a small current consumption of the receiver is achieved, by using this solution, problems created by clock signals and other interfering signals of a stable frequency which impact on the frequency of the received channel can be removed, which lessens the need for shielding of the device.

A solution according to the invention is applied preferably in receivers of digital time-division mobile communication systems such as GSM and PCN systems, but the invention can be applied also in receivers of analog systems, for example, if the received analog signal is converted to a digital form for signal processing.

Some embodiments of the solution according to the invention have been presented above. Naturally the principle according to the invention can be modified within the frame of the scope of the claims, for example, by modification of the details of the implementation and the ranges of use. It should be noted that the presented circuit connections and component values have been described only as examples and they can be modified according to generally known design principles.

What is claimed is:

1. A circuit arrangement for processing a received radio frequency signal in a direct conversion receiver, said circuit arrangement comprising a demodulator for directly demodulating the received radio frequency signal into a baseband signal, a control circuit coupled to said demodulator for controlling the strength of the baseband signal, first separating means coupled to said control circuit for separating of direct voltage occurring in the baseband signal, an analog-to-digital converter coupled to said first separating means, means for controlling the direct voltage component of a first baseband signal preceding said first separating means on the basis of a first control signal, and means for controlling the direct voltage component of a second baseband signal following the separating means on the basis of a second control signal.

2. A circuit arrangement according to claim 1, further comprising a second separating means for separating the direct voltage component which occurs in said control circuit from the constant potential.

3. A circuit arrangement according to claim 2, further comprising means for controlling the charge state of said second separating means by said second control signal for controlling the direct voltage component which occurs in the control circuit.

4. A circuit arrangement according to claim 1, wherein the signal line between the demodulator and the first separating means has been direct voltage coupled.

5. A circuit arrangement according to claim 1, wherein the demodulator is an I/Q demodulator and to the output of its quadrature signal, a first branch has been connected for processing a baseband quadrature signal and to the output of the in-phase signal, a second branch has been connected for processing the in-phase baseband signal.

6. A circuit arrangement according to claim 1, further comprising means for connecting a second signal to the output of the separating means and means for forming said second signal on the basis of a first signal preceding the separating means.

7. A circuit arrangement according to claim 1, wherein the first and second control signals are identical.

8. A mobile station receiver comprising the circuit arrangement of claim 1.

9. A digital time division mobile communication system comprising the circuit arrangement of claim 1.

10. A method for processing a received radio frequency signal in a direct conversion receiver, said method comprising:
   directly demodulating the received signal to an analog baseband signal;
   controlling the strength of the analog baseband signal using a control circuit;
   separating DC from said analog baseband signal using a first separating means;
   converting the analog baseband signal to a digital signal;
   controlling the DC component of a baseband signal at the input of the separating step in accordance with a first control signal; and
   controlling the DC component of a baseband signal at the output of the first separating means in accordance with a second control signal.

11. A method according to claim 10, wherein the signal which is demodulated to a baseband is conducted to said first separating means as direct voltage coupled.

12. A method according to claim 10, wherein the direct voltage component which occurs in said strength control circuit is separated from the constant potential by a second separating means of direct voltage and the charge state of said second separating means of direct voltage is controlled by a second control signal for controlling the direct voltage component occurring in the control circuit.

13. A method according to claim 10, wherein said first and second control signals are switched to an active state at least partially coincident in time.

14. A method according to claim 10, wherein said first and second control signals are switched to an active state before the start of the time slot which contains information of the received signal.

15. A method according to claim 10, wherein for reducing of the offset voltage, to the output of said first separating means a second signal is connected which is formed on the basis of the first signal preceding said separating means.

16. The method of claim 10, wherein said first and second control signals are identical.

17. A mobile station receiver operated in accordance with the method of claim 10.

18. A mobile digital time division communication system operated in accordance with the method of claim 10.

* * * * *